(12) United States Patent
Lee et al.

(10) Patent No.: US 8,911,881 B2
(45) Date of Patent: Dec. 16, 2014

(54) ORGANIC LIGHT-EMITTING DEVICE

(75) Inventors: Jun-Yeob Lee, Suwon-si (KR); Min-Seung Chun, Suwon-si (KR); Yong-Joong Choi, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 2597 days.

(21) Appl. No.: 11/256,954

(22) Filed: Oct. 25, 2005

(65) Prior Publication Data

US 2006/0099447 A1 May 11, 2006

(30) Foreign Application Priority Data

Nov. 5, 2004 (KR) .................. 10-2004-0089651
Nov. 27, 2004 (KR) .................. 10-2004-0098370

(51) Int. Cl.
*H01L 51/54* (2006.01)
*H05B 33/14* (2006.01)
*C09K 11/06* (2006.01)
*H01L 51/50* (2006.01)
*H01L 51/00* (2006.01)

(52) U.S. Cl.
CPC ......... *C09K 11/06* (2013.01); *C09K 2211/1044* (2013.01); *C09K 2211/1014* (2013.01); *H01L 51/0071* (2013.01); *H01L 51/0081* (2013.01); *H01L 51/0072* (2013.01); *H05B 33/14* (2013.01); *C09K 2211/186* (2013.01); *H01L 51/0085* (2013.01); *H01L 51/006* (2013.01); *H01L 51/5016* (2013.01); *C09K 2211/181* (2013.01); *C09K 2211/1029* (2013.01); *Y10S 428/917* (2013.01)
USPC .................. 428/690; 428/917; 313/504

(58) Field of Classification Search
None
See application file for complete search history.

(56) References Cited

U.S. PATENT DOCUMENTS

| 7,767,316 B2 * | 8/2010 | Deaton et al. ............... 428/690 |
| 2002/0074935 A1 | 6/2002 | Kwong et al. |
| 2002/0101154 A1 | 8/2002 | Seo et al. |
| 2002/0125818 A1 | 9/2002 | Sato et al. |
| 2002/0182441 A1 | 12/2002 | Lamansky et al. |
| 2003/0072964 A1 * | 4/2003 | Kwong et al. ............... 428/690 |
| 2003/0218418 A9 * | 11/2003 | Sato et al. ............... 313/504 |
| 2003/0234607 A1 * | 12/2003 | Kim et al. ............... 313/502 |
| 2004/0155238 A1 | 8/2004 | Thompson et al. |
| 2006/0115679 A1 * | 6/2006 | Chun et al. ............... 428/690 |
| 2009/0236974 A1 * | 9/2009 | Tamaru et al. ............... 313/504 |

FOREIGN PATENT DOCUMENTS

| CN | 1474639 | 2/2004 |
| JP | 2002-313583 | 10/2002 |
| JP | 2003-007467 | 1/2003 |
| JP | 2004-022544 | 1/2004 |
| JP | 2004-296185 | 10/2004 |
| KR | 1020030041972 | 5/2003 |
| KR | 10-2003-0097363 | 12/2003 |
| KR | 1020030093242 | 12/2003 |
| WO | WO 2005/029923 A1 * | 3/2005 |

OTHER PUBLICATIONS

European Search Report dated Feb. 24, 2006.
Xiong Gong, et al., "Phosphorescence From Iridium Complexes Doped Into Polymer Blends", Journal of Applied Physics, vol. 95, No. 3, pp. 948-953, Feb. 1, 2004.
Kathleen M. Vaeth, et al., "High-Efficiency Doped Polymeric Organic Light-Emitting Diodes", Journal of Polymer Science, vol. 41, pp. 2715-2725, 2003.
Noriyuki Matsusue, et al., "Charge Carrier Transport in an Emissive Layer of Green Electrophosphorescent Devices", Applied Physics Letters, vol. 85, No. 18, pp. 4046-4048, Nov. 1, 2004.
Chinese Office Action dated Dec. 26, 2008.

* cited by examiner

*Primary Examiner* — Marie R. Yamnitzky

(74) *Attorney, Agent, or Firm* — H.C. Park & Associates, PLC

(57) ABSTRACT

An organic light-emitting device is provided. The organic light-emitting device comprises a first electrode, a second electrode, and a light-emitting layer interposed between the first electrode and the second electrode. The device further comprises of a phosphorescent dopant and a phosphorescent host that includes at least two hole transport materials. The mixed phosphorescent host materials increase energy transfer efficiency, thereby improving the efficiency and lifespan of the resulting organic light-emitting device.

8 Claims, 2 Drawing Sheets

FIG. 3

| CATHODE |
|---|
| EIL |
| ETL |
| EML |
| HTL |
| HIL |
| ANODE |
| SUBSTRATE | the description, or may be learned by practice of the invention.

ORGANIC LIGHT-EMITTING DEVICE

CROSS REFERENCE TO RELATED APPLICATIONS

This application claims priority to and the benefit of Korean Patent Application No. 10-2004-0089651 filed on Nov. 5, 2004, in the Korean Intellectual Property Office, and Korean Patent Application No. 10-2004-0098370 filed on Nov. 27, 2004, in the Korean Intellectual Property Office, the disclosures of which are incorporated herein in their entirety by reference.

BACKGROUND OF THE INVENTION

1. Field of the Invention

The present invention relates to an organic light-emitting device in which at least two hole transport materials are used as phosphorescent hosts, thereby improving the efficiency and the lifespan of the device.

2. Description of the Background

Light-emitting materials that are used in organic light-emitting devices are classified into fluorescent materials that use singlet excitons and phosphorescent materials that use triplet excitons, which differ in their emission mechanisms.

Generally, a phosphorescent material comprises an organic metal compound that includes heavy atoms. In a phosphorescent material, an exciton transitions from a triplet state to a singlet state and emits light as a result. The phosphorescent material may use the triplet excitons, which make up 75% of the excitons, and therefore has much higher emission efficiency than the fluorescent material that uses singlet excitons, which make up the remaining 25% of excitons.

A light-emitting layer comprising a phosphorescent material includes host material and a dopant material that receives energy from the phosphorescent host material to emit light. Several phosphorescent dopant materials using an iridium metal compound have been reported by Princeton University and the University of Southern California. Specifically, (4,6-$F_2$ppy)$_2$Irpic and an iridium compound based on a fluorinated ppy ligand structure have been developed as blue light-emitting materials. Their host material is typically 4,4'-biscarbazolylbiphenyl (CBP). It has been reported that a triplet state energy band gap of a CBP molecule is appropriate for producing green and red light, but since the energy band gap of a CBP molecule is less than the energy gap of a blue material, a very inefficient endothermic energy transition may be required to produce blue light. As a result, a CBP host causes a blue light-emitting material to have low emission efficiency and a short lifespan.

Recently, a carbazole-based compound that has a larger triplet energy band gap than CBP has been used when forming the light-emitting layer with a phosphorescent material.

However, when a conventional carbazole-based compound is used, a phosphorescence device may be inefficient and have a short lifespan, and may have much room for improvement.

SUMMARY OF THE INVENTION

The present invention provides an organic light-emitting device that may have improved emission efficiency and lifespan.

Additional features of the invention will be set forth in the description which follows, and in part will be apparent from the description, or may be learned by practice of the invention.

The present invention discloses an organic light-emitting device comprising a first electrode, a second electrode, and a light-emitting layer interposed between the first electrode and the second electrode. The light-emitting layer comprises a phosphorescent dopant and a phosphorescent host comprising at least two hole transport materials.

The present invention also discloses an organic light-emitting device comprising a first electrode, a second electrode, and a light-emitting layer interposed between the first electrode and the second electrode. The light-emitting layer comprises a phosphorescent dopant, a first phosphorescent host having that has a triplet energy of about 2.3 eV to about 3.5 eV and a second phosphorescent host that has a triplet energy of about 2.3 eV to about 3.5 eV. The first phosphorescent host and the second phosphorescent host have different highest occupied molecular orbital (HOMO) energy levels or different lowest unoccupied molecular orbital (LUMO) energy levels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 3 is a sectional view of an organic light-emitting device according to an exemplary embodiment of the present invention.

DETAILED DESCRIPTION OF THE ILLUSTRATED EMBODIMENTS

Figure 1:
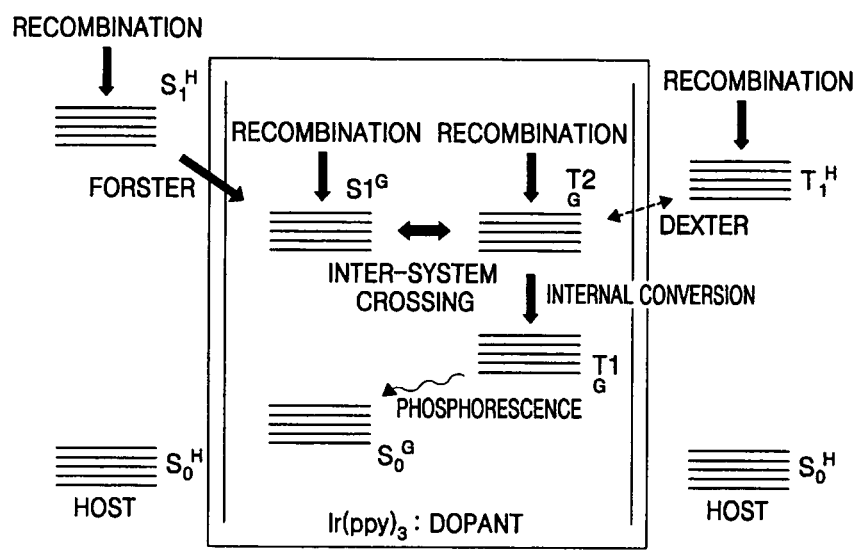
FIG. 1 is an energy diagram of a light-emitting layer of an organic light-emitting device according to the present invention.

The organic light-emitting device of the present invention comprises a light-emitting layer that comprises at least two hole transport materials as phosphorescent hosts and a phosphorescent dopant, to improve the emission efficiency and lifespan of the organic light-emitting device.

According to an exemplary embodiment of the present invention, an organic light-emitting device includes a first electrode, a second electrode, and a light-emitting layer interposed between the first electrode and the second electrode. The light-emitting layer comprises a phosphorescent dopant and a phosphorescent host that comprises at least two hole transport materials. At least two hole transport materials are used to increase a recombination probability in the light-emitting layer, thereby improving the device's efficiency and lifespan.

The hole transport materials may include a first hole transport material and a second hole transport material. The first hole transport material and the second hole transport material may have different highest occupied molecular orbital (HOMO) energy levels or different lowest unoccupied molecular orbital (LUMO) energy levels.

When the first hole transport material and the second hole transport material do not have the same energy levels, the injected holes and electrons move at a more stable energy level. Therefore, the holes and the electrons have a high recombination probability within the light-emitting layer, and charges are not transferred out of the light-emitting layer. When the two materials have the same energy levels, this effect cannot be obtained. Thus, when the two materials have a different HOMO energy level or a different LUMO energy level charges can move at a stable energy level.

The triplet energy of the phosphorescent host refers to an energy difference between a ground singlet state and a triplet state. The triplet energy of each of the first hole transport material and the second hole transport material is preferably about 2.3 eV to about 3.5 eV. If the triplet energy is less than 2.3 eV, energy is inefficiently transferred to the phosphorescent dopant, thereby degrading the operating characteristics of the device. If the triplet energy is greater than 3.5 eV, a driving voltage rises undesirably or the efficiency decreases.

The first hole transport material and the second hole transport material are preferably carbazole-based compounds.

Examples of the carbazole-based compounds may include, but are not limited to 1,3,5-tricarbazolylbenzene, 4,4'-biscarbazolylbiphenyl (CBP), polyvinylcarbazole, m-biscarbazolylphenyl, 4,4'-biscarbazolyl-2,2'-dimethylbiphenyl (dmCBP), 4,4'4"-tri(N-carbazolyl)triphenylamine, 1,3,5-tris(2-carbazolylphenyl)benzene, 1,3,5-tris(2-carbazolyl-5-methoxyphenyl)benzene and bis(4-carbazolylphenyl)silane.

CBP is preferably used as the first hole transport material and the second hole transport material preferably comprises materials that have a broader band gap than CBP. Under these conditions, charges effectively recombine in the light-emitting layer to increase the emission efficiency.

The first hole transport material and the second hole transport material may have a mixing weight ratio of about 1:3 to about 3:1, and preferably about 3:1. If the concentration of the first hole transport material is less than the above range, the operating characteristics do not improve in comparison with using a single host. If the concentration of the first hole transport material is greater than the above range, the emission efficiency does not improve.

The light-emitting layer may comprise about 70 parts by weight to about 99 parts by weight of the phosphorescent hosts and about 1 part by weight to about 30 parts by weight of the phosphorescent dopant based on 100 parts by weight of the light-emitting layer. If the concentration of the phosphorescent hosts is less than 70 parts by weight, triplet quenching occurs, thereby reducing the emission efficiency. If the concentration of the phosphorescent hosts is greater than 99 parts by weight, the light-emitting material is ineffective, thereby reducing the emission efficiency and the lifespan of the resulting device.

The phosphorescent dopant used in the formation of the light-emitting layer may be represented by Ir(L)3 or Ir(L)2L', in which L and L' are selected from the following structures:

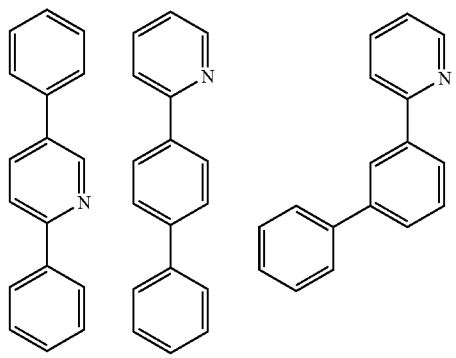

-continued

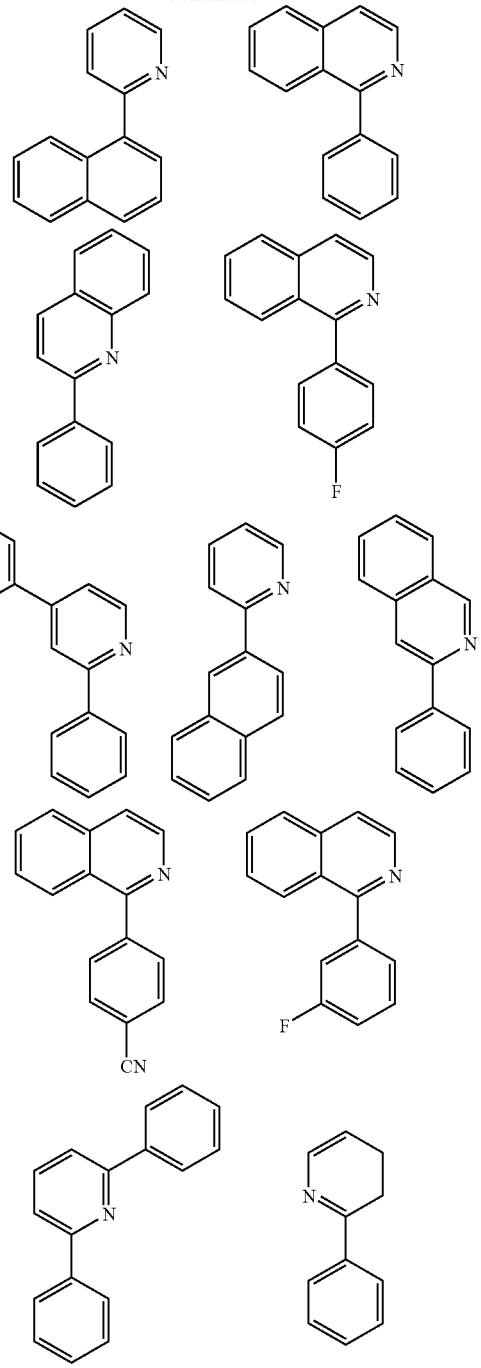

The light-emitting material may include, but is not limited to, bisthienylpyridine acetylacetonate iridium, bis(benzothienylpyridine)acetylacetonate iridium, bis(2-phenylbenzothiazole)acetylacetonate iridium, bis(1-phenylisoquinoline)iridium acetylacetonate, tris(1-phenylisoquinoline), tris(phenylpyridine)iridium, tris(2-phenylpyridine)iridium, tris(2-phenylpyridine)iridium, tris(3-biphenylpyridine)iridium, tris(4-biphenylpyridine)iridium, and the like.

The light-emitting layer preferably comprises a phosphorescent dopant and CBP and dmCBP as phosphorescent hosts. In particular, the phosphorescent dopant is (2-phenylpyridine)iridium [Ir(ppy)$_3$] and its concentration is preferably about 1 part by weight to about 3 parts by weight based on 100 parts by weight of the light-emitting layer. When the concentration of the phosphorescent dopant is less than 1 part by weight, the emission efficiency and lifespan of the resulting device are reduced. When the concentration of the phosphorescent dopant is greater than 30 parts by weight, concentration quenching occurs, thereby reducing the emission efficiency.

The organic light-emitting device according to an exemplary embodiment of the present invention may further comprise at least one of a hole injection layer and a hole transport layer interposed between the first electrode and the light-emitting layer. The organic light-emitting device according to an exemplary embodiment of the present invention may further comprise at least one of a hole blocking layer, an electron transport layer, and an electron injection layer interposed between the light-emitting layer and the second electrode.

According to another exemplary embodiment of the present invention, a phosphorescent dopant is used to form a light-emitting layer. The light-emitting layer further includes a first phosphorescent host and a second phosphorescent host with a triplet energy of about 2.3 eV to about 3.5 eV. When the first phosphorescent host and the second phosphorescent host have different HOMO energy levels and/or different LUMO energy levels, the recombination efficiency of holes and electrons is increased, thereby improving emission efficiency.

If the triplet energy of the phosphorescent host is less than 2.3 eV, energy is inefficiently transferred to the phosphorescent dopant. If the triplet energy is greater than 3.5 eV, the driving voltage rises. Additionally, if the difference between the HOMO energy level of the first phosphorescent host and the HOMO energy level of the second phosphorescent host is zero, and the difference between the LUMO energy level of the first phosphorescent dopant and the LUMO energy level of the second phosphorescent dopant is zero, the emission efficiency is reduced.

The first phosphorescent host may have a HOMO energy level of about 5.5 eV to about 7.0 eV, and a LUMO energy level of about 2.1 eV to about 3.5 eV. The second phosphorescent host may have a HOMO energy level of about 5.5 eV to about 7.0 eV, and a LUMO energy level of about 2.1 eV to about 3.5 eV. The first phosphorescent host and the second phosphorescent host are selected to satisfy the conditions of the HOMO and LUMO energy levels.

Further, the first phosphorescent host is selected to have less triplet energy than the second phosphorescent host. Additionally, each of the first phosphorescent host and the second phosphorescent host may have an energy band gap of about 2.5 eV to about 4.0 eV between the HOMO and LUMO energy levels.

Figure 2:
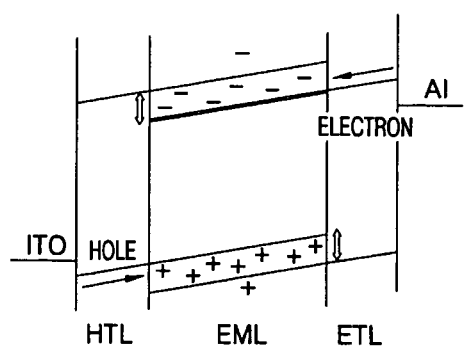
FIG. 2 illustrates an energy level of an organic light-emitting device according to the present invention.

FIG. 1 is an energy level diagram of the light-emitting layer of the organic light-emitting device according to an exemplary embodiment of the present invention, and FIG. 2 illustrates the energy level of the organic light-emitting device according to the present invention.

An embodiment of the present invention will now be described with reference to FIG. 1 and FIG. 2. The phosphorescent dopant may comprise, tris(2-phenylpyridine)iridium $(Ir(PPy)_3)$, for example.

In order to allow an energy transition in the light-emitting layer comprised of a phosphorescent material, the triplet energy of the phosphorescent host is greater than the triplet energy of the phosphorescent dopant. Accordingly, the triplet energy of the phosphorescent host has a longer wavelength than a red light-emitting material. Therefore, the phosphorescent host preferably has a triplet energy of 2.3 eV or greater. Additionally, since the first phosphorescent host and the second phosphorescent host do not have the same energy levels in the present embodiment, the injected holes and electrons move at a more stable energy level. Therefore, the holes and the electrons have a high recombination probability in the light-emitting layer, and charges are not transferred out of the light-emitting layer.

On the other hand, if the first phosphorescent host and the second phosphorescent host have the same energy level, the above-described effect is not generated. Accordingly, the first phosphorescent host and the second phosphorescent host should have different HOMO and LUMO energy levels to move the electrons at the stable energy level.

In FIG. 1, $S_1^H$ denotes a singlet excited state of the phosphorescent host, $S_0^H$ denotes a singlet ground state of the phosphorescent host, $T_1^H$ denotes a triplet excited state of the phosphorescent host, $S_1^G$ denotes a singlet excited state of the phosphorescent dopant, $S_0^G$ denotes a singlet ground state of the phosphorescent dopant, and T1 and T2 respectively denote triplet excited states of the phosphorescent dopant.

The first phosphorescent host and the second phosphorescent host may include, but are not limited to 4,4'-biscarbazolylbiphenyl (CBP) (triplet energy: 2.56 eV, HOMO=5.8 eV, LUMO=3.0 eV), 2,9-dimethyl-4,7-diphenyl-9,10-phenanthroline (BCP) (triplet energy: 2.5 eV, HOMO=6.3 eV, LUMO=3.0 eV), and BAlq3 (triplet energy: 2.4 eV, HOMO=5.9 eV, LUMO=2.8 eV).

The first phosphorescent host and the second phosphorescent host may have a mixing weight ratio of about 10:90 to about 90:10.

The light-emitting layer may comprise about 70 parts by weight to about 99 parts by weight of the phosphorescent host and about 1 part by weight to about 30 parts by weight of the phosphorescent dopant based on 100 parts by weight of the light-emitting layer. If the concentration of the phosphorescent host is less than 70 parts by weight, triplet quenching occurs, thereby reducing the emission efficiency. If the concentration of the phosphorescent host is greater than 99 parts by weight, the light-emitting material is ineffective, thereby reducing the emission efficiency and the lifespan of the resulting device.

The phosphorescent dopant is the light-emitting material. The light-emitting material may include, but is not limited to bisthienylpyridine acetylacetonate iridium, bis(benzothienylpyridine)acetylacetonate iridium, bis(2-phenylbenzothiazole)acetylacetonate iridium, bis(1-phenylisoquinoline)iridium acetylacetonate, tris(1-phenylisoquinoline)iridium, tris(2-phenylpyridine)iridium $(Ir(PPy)_3)$, tris(2-biphenylpyridine)iridium, tris(3-biphenylpyridine)iridium, tris(4-biphenylpyridine)iridium, and the like.

FIG. 3 is a sectional view of an organic light-emitting device according to an exemplary embodiment of the present invention.

Referring to FIG. 3, a method for fabricating the organic light-emitting device according to an exemplary embodiment of the present invention will now be described.

First, an anode material is coated on a substrate to form an anode as a first electrode. Here, the substrate is any general substrate that may be used in a general organic light-emitting device. The substrate may be a waterproof organic substrate that has excellent transparency, surface smoothness, and easy treatment, or it may be a transparent plastic substrate. The anode may be formed of indium tin oxide (ITO), indium zinc oxide (IZO), tin dioxide $(SnO_2)$, zinc oxide (ZnO) or the like.

A hole injection layer material is vacuum thermally-deposited or spin-coated on the anode to selectively form a hole injection layer (HIL). The hole injection layer may be about 50 Å to about 1500 Å thick. If the hole injection layer is less than 50 Å thick, hole injection characteristics may deteriorate. If the hole injection layer is greater than 1500 Å thick, the driving voltage increases.

The hole injection layer may comprise copper phthalocyanine (CuPc), or TCTA, m-MTDATA and IDS 406 (Idemitz, Inc.), which are Starburst-type amines, but is not specifically limited to these materials.

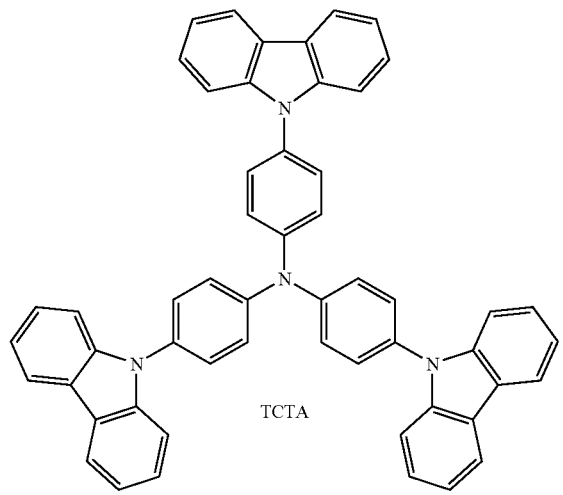

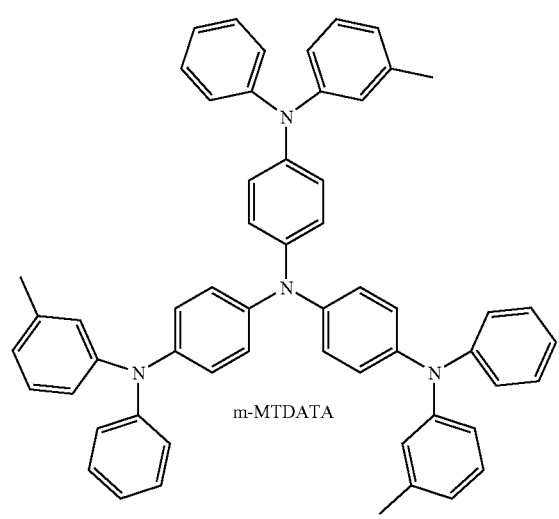

A hole transport layer material is thermally-evaporated or spin-coated on the hole injection layer to selectively form a hole transport layer (HTL). The hole transport layer may include, but is not limited to N,N'-bis(3-methylphenyl)-N,N'-diphenyl-[1,1-biphenyl]-4,4'-diamine (TPD), N,N'-di(naphthalene-1-yl)-N,N'-diphenyl benxidine (NPD), IDE320 (Itemitz, Inc.), N,N'-diphenyl-N,N'-bis(1-naphthyl)-(1,1'-biphenyl)-4,4'-diamine (NPB), and the like. The hole transport layer may be about 50 Å to about 1500 Å thick. If the hole transport layer is less than 50 Å thick, hole transport characteristics deteriorate. If the hole transport layer is greater than 1500 Å thick, the driving voltage increases.

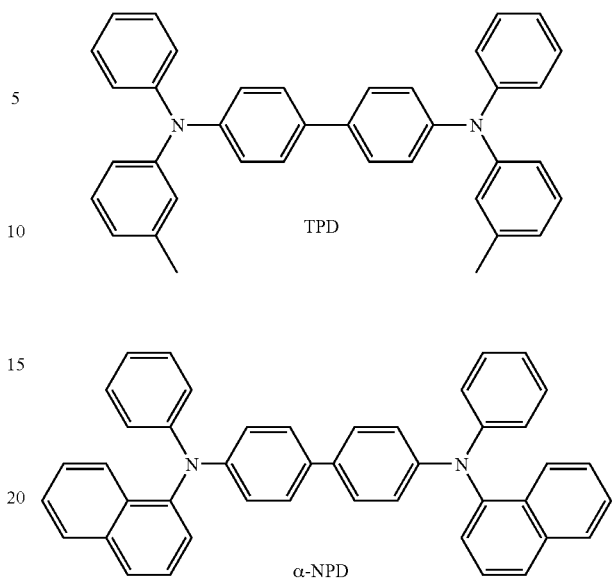

Next, a first phosphorescent host and a second phosphorescent host that satisfy the above energy conditions are used together with a phosphorescent dopant to form a light-emitting layer (EML) on the hole transport layer. The light-emitting layer may be formed by vacuum deposition, ink jet printing, laser induced thermal imaging, photolithography or the like, but is not limited thereto.

The light-emitting layer may be about 100 Å to about 800 Å thick, and in particular, about 300 Å to about 400 Å. If the light-emitting layer is less than 10 Å thick, the efficiency and the lifespan of the light-emitting layer may decrease. If the light-emitting layer is greater than 800 Å thick, the driving voltage may increase.

A hole blocking layer material may be vacuum-deposited or spin-coated on the light-emitting layer to form a hole blocking layer (HBL) (not shown), if necessary. The hole blocking layer material is not particularly limited, but may have an electron transporting ability and a higher ionization potential than the light-emitting compound. Examples of such a material include Balq, BCP, TPBI, etc. The HBL is about 30 Å to about 500 Å thick. If the HBL is less than 30 Å thick, the hole blocking property is poor. If the HBL is greater than 500 Å thick, the driving voltage increases.

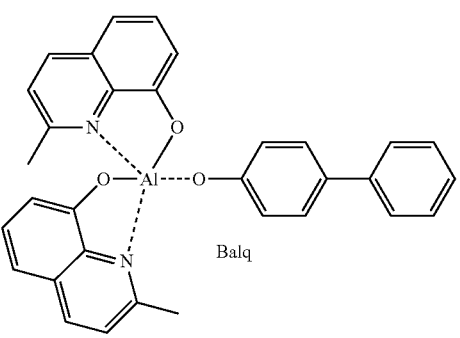

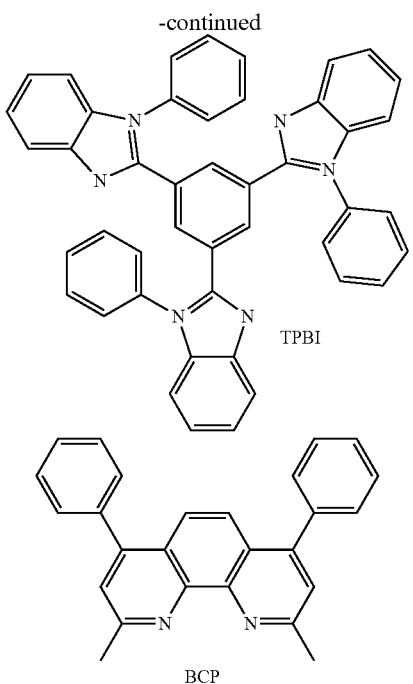

TPBI

BCP

An electron transport layer (ETL) may be formed on the HBL or the EML by vacuum deposition or spin coating. The electron transport layer may comprise, but is not limited to Alq3. The electron transport layer may be about 50 Å thick to about 600 Å thick. If the electron transport layer is less than about 50 Å thick, the lifespan of the electron transport layer decreases. If the electron transport layer is greater than 600 Å thick, the driving voltage increases.

Further, an electron injection layer (EIL) may be selectively formed on the electron transport layer. The electron injection layer may comprise LiF, NaCl, CsF, $Li_2O$, BaO, Liq or the like. The electron injection layer may be about 1 Å thick to about 100 Å thick. If the electron injection layer is less than 1 Å thick, it functions ineffectively, thereby increasing the driving voltage. If the electron injection layer is greater than 100 Å thick, it functions as an insulating layer, thereby increasing the driving voltage.

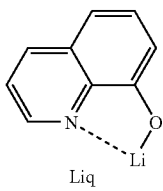

Liq

Next, a cathode metal is vacuum thermally-deposited on the electron injection layer (EIL) to form a cathode as a second electrode, thereby completing the organic light-emitting device.

The cathode metal may include, but is not limited to lithium, magnesium, aluminium, aluminium-lithium, calcium, magnesium-indium, magnesium-silver, and the like.

The organic light-emitting device according to an exemplary embodiment of the present invention may further comprise one or two intermediate layers depending on the compositions of the anode, the hole injection layer, the hole transport layer, the light-emitting layer, the electron transport layer, the electron injection layer, and the cathode. In addition to the aforementioned layers, an electron blocking layer may be embedded in the organic light-emitting device.

Hereinafter, the present invention will be described using the following example, which is not intended to limit the present invention.

Example 1

In order to prepare an anode, a 15 $\Omega/cm^2$ (1200 Å) ITO glass substrate (Corning Inc.) was cut to a size of 50 mm×50 mm×0.7 mm, and then the cut glass substrate was rinsed using ultrasonic waves for five minutes in each of isopropyl alcohol and deionized water, and then the rinsed glass substrate was exposed to ultraviolet rays and ozone for thirty minutes.

Then, N,N'-di(1-naphthyl)-N,N'-diphenyl-benzidine (NPD) was vacuum-deposited on the substrate to form a 600 Å thick hole transport layer.

90 parts by weight of CBP and 10 parts by weight of dmCBP based on 100 parts by weight of host materials and 5 parts by weight of Ir(PPy)$_3$ as a phosphorescent dopant based on 100 parts by weight of the light-emitting layer were vacuum-deposited on the hole transport layer to form a 400 Å light-emitting layer.

Alq3 was deposited on the light-emitting layer to form a 300 Å thick electron transport layer.

A 10 Å thick electron injection layer comprising LiF and a 1000 Å thick cathode comprising Al were sequentially vacuum-deposited on the electron transport layer to form a LiF/Al electrode, thereby forming the organic light-emitting device.

Example 2

An organic light-emitting device was fabricated in the same manner as in Example 1, except that 75 parts by weight of CBP and 25 parts by weight of dmCBP were used to form the light-emitting layer.

Example 3

An organic light-emitting device was fabricated in the same manner as in Example 1, except that 50 parts by weight of CBP and 50 parts by weight of dmCBP were used to form the light-emitting layer.

Example 4

An organic light-emitting device was fabricated in the same manner as in Example 1, except that 25 parts by weight of CBP and 75 parts by weight of dmCBP were used to form the light-emitting layer.

Example 5

An organic light-emitting device was fabricated in the same manner as in Example 1, except that 10 parts by weight of CBP and 90 parts by weight of dmCBP were used to form the light-emitting layer.

Comparative Example 1

In order to prepare an anode, a 15 $\Omega/cm^2$ (1200 Å) ITO glass substrate (Corning Inc.) was cut to a size of 50 mm×50 mm×0.7 mm, and then the cut glass substrate was rinsed using ultrasonic waves for five minutes in each of isopropyl alcohol and deionized water using ultrasonic waves, and then the rinsed glass substrate was exposed to ultraviolet rays and ozone for thirty minutes.

Then, NPD was vacuum-deposited on the substrate to form a 600 Å hole transport layer. 100 parts by weight of CBP based on 100 parts by weight of the host material and 10 parts by weight of Ir(PPy)$_3$ as a phosphorescent dopant were vacuum-deposited on the hole transport layer to form a 400 Å light-emitting layer.

Alq3 as an electron transport material was deposited on the light-emitting layer to form a 300 Å thick electron transport layer.

A 10 Å thick electron injection layer comprising LiF and a 1000 Å cathode comprising Al were sequentially vacuum-deposited on the electron transport layer to form a LiF/Al electrode, thereby forming the organic light-emitting device as illustrated in FIG. 1.

Comparative Example 2

An organic light-emitting device was manufactured in the same manner as in Comparative Example 1, except that 100 parts by weight of dmCBP based on 100 parts by weight of the host material and 10 parts by weight of Ir(PPy)$_3$ as a phosphorescent dopant were used to form a light-emitting layer.

The organic light-emitting devices that were fabricated in Example 1, Example 2, Example 3, Example 4, Example 5, Comparative Example 1, and Comparative Example 2 were tested for emission efficiency and lifetime characteristics.

The emission efficiency was measured using a spectrometer and the lifespans were evaluated using a photodiode. The results are indicated in Table 1.

The organic light-emitting devices of Comparative Example 1 and Comparative Example 2 had an emission efficiency of about 24 cd/A and 22 cd/A, respectively, and the organic light-emitting devices of Examples 2 and 3 had the emission efficiency of 30 cd/A. Thus, the organic light-emitting devices of the present invention have improved emission efficiency.

The lifespan is determined as the time it takes for an initial emission brightness to be reduced by 50%. The lifespan of the organic light-emitting device of Example 2 was 8,000 hours at 1000 cd/m$^2$ and lifetimes of the organic light-emitting devices of Comparative Example 1 and Comparative Example 2 were 5,000 hours and 4,000 hours, respectively, at 1000 cd/m$^2$. Thus, it can be seen that the organic light-emitting devices of the present invention have improved lifespans.

TABLE 1

|  | CBP:dmCBP | Efficiency (cd/A) | Lifetime (h) |
| --- | --- | --- | --- |
| Example 1 | 90:10 | 25 | 5500 |
| Example 2 | 75:25 | 30 | 8000 |
| Example 3 | 50:50 | 30 | 7000 |
| Example 4 | 25:75 | 28 | 7000 |
| Example 5 | 10:90 | 23 | 5000 |
| Comparative Example 1 | 100:0 | 24 | 5000 |
| Comparative Example 2 | 0:100 | 22 | 4000 |

Example 6

In order to obtain an anode, a 15 Ω/cm$^2$ (1200 Å) ITO glass substrate (Corning Inc.) was cut to a size of 50 mm×50 mm×0.7 mm, and then the cut glass substrate was rinsed in each of isopropyl alcohol and deionized water using ultrasonic waves for five minutes, and then the rinsed glass substrate was exposed to ultraviolet rays and ozone for thirty minutes.

Then, N,N'-di(naphthalene-1-yl)-N,N'-diphenyl-benxidine (NPD) was vacuum-deposited on the substrate to form a 600 Å hole transport layer.

75 parts by weight of CBP and 25 parts by weight of BCP based on 100 parts by weight of the host materials and 5 parts by weight of Ir(PPy)$_3$ based on 100 parts by weight of the light-emitting layer were vacuum-deposited on the hole transport layer to form a 400 Å thick light-emitting layer.

Alq3 was deposited on the light-emitting layer to form a 300 Å thick electron transport layer.

A 10 Å thick electron injection layer comprising LiF and a 1000 Å thick cathode comprising Al were sequentially vacuum-deposited on the electron transport layer to form a LiF/Al electrode, thereby forming the organic light-emitting device.

Comparative Example 3

An organic light-emitting device was fabricated in the same manner as in Example 6, except that Alq3 (triplet energy: 2.0 eV, HOMO=5.8 eV, LUMO=3.0 eV) was used instead of BCP to form the light-emitting layer.

Comparative Example 4

An organic light-emitting device was fabricated in the same manner as Example 6, except that BCP was not used to form the light-emitting layer.

The organic light-emitting devices fabricated in Example 6, Comparative Example 3, and Comparative Example 4 were tested for emission efficiency and lifespan.

The organic light-emitting device of Comparative Example 3 had an emission efficiency of about 10 cd/A and a lifespan of 1000 h (@1000 cd/m$^2$). The organic light-emitting device of Comparative Example 4 had an emission efficiency of about 24 cd/A and a lifespan of 5000 h (@1000 cd/m$^2$). The organic light-emitting device of Example 6 had an emission efficiency of about 32 cd/A and a lifespan of 10,000 h (@1000 cd/m$^2$). In comparison with Comparative Example 4, the organic light-emitting device of Example 6 had better emission efficiency and lifespan. The obtained results are indicated in Table 2.

TABLE 2

|  | Host material | Efficiency (cd/A) | Lifetime (h) |
| --- | --- | --- | --- |
| Example 6 | CBP, BCP | 32 | 10000 |
| Comparative Example 3 | CBP, Alq3 | 10 | 1000 |
| Comparative Example 4 | CBP | 24 | 5000 |

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. An organic light-emitting device, comprising:
a first electrode;
a second electrode; and a light-emitting layer interposed between the first electrode and the second electrode,
wherein the light-emitting layer consists of a phosphorescent dopant and two phosphorescent hosts,
wherein the two phosphorescent hosts are 4,4'-biscarbazolylbiphenyl (CBP) and 4,4'-biscarbazolyl-2,2'-dimethylbiphenyl (dmCBP), and
wherein CBP and dmCBP are combined in a weight ratio of about 1:3 to about 3:1.

2. The organic light-emitting device of claim 1, wherein the light-emitting layer consists of about 70 parts by weight to about 99 parts by weight of the two phosphorescent hosts and about 1 part by weight to about 30 parts by weight of the phosphorescent dopant.

3. The organic light-emitting device of claim 1, further comprising at least one of a hole injection layer and a hole transport layer interposed between the first electrode and the light-emitting layer.

4. The organic light-emitting device of claim 1, further comprising at least one of a hole blocking layer, an electron transport layer, and an electron injection layer interposed between the light-emitting layer and the second electrode.

5. An organic light-emitting device, comprising:
a first electrode;
a second electrode; and
a light-emitting layer interposed between the first electrode and the second electrode;
wherein the light-emitting layer consists of:
a phosphorescent dopant;
a first phosphorescent host having a triplet energy of about 2.3 eV to about 3.5 eV; and
a second phosphorescent host having a triplet energy of about 2.3 eV to about 3.5 eV,
wherein the first phosphorescent host and the second phosphorescent host have different highest occupied molecular orbital (HOMO) energy levels and/or different lowest unoccupied molecular orbital (LUMO) energy levels,
wherein the phosphorescent dopant is one material selected from the group consisting of bis(thienylpyridine) acetylacetonate iridium and bis(1-phenylisoquinoline)iridium acetylacetonate,
wherein the first phosphorescent host and the second phosphorescent host are combined in a weight ratio of about 1:3 to about 3:1, and
wherein the first phosphorescent host is 4,4'-biscarbazolylbiphenyl (CBP) and the second phosphorescent host is 4,4'-biscarbazolyl-2,2'-dimethylbiphenyl (dmCBP).

6. The organic light-emitting device of claim 5, wherein the light-emitting layer consists of about 70 parts by weight to about 99 parts by weight of the phosphorescent hosts and about 1 part by weight to about 30 parts by weight of the phosphorescent dopant.

7. The organic light-emitting device of claim 5, further comprising at least one of a hole injection layer and a hole transport layer interposed between the first electrode and the light-emitting layer.

8. The organic light-emitting device of claim 5, further comprising at least one of a hole blocking layer, an electron transport layer, and an electron injection layer interposed between the light-emitting layer and the second electrode.

* * * * *